(12) United States Patent
Yamaguchi et al.

(10) Patent No.: US 10,209,155 B2
(45) Date of Patent: Feb. 19, 2019

(54) PHYSICAL QUANTITY SENSING SEMICONDUCTOR DEVICE AND METHOD FOR MANUFACTURING THE SAME

(71) Applicant: DENSO CORPORATION, Kariya, Aichi-pref. (JP)

(72) Inventors: Kouhei Yamaguchi, Kariya (JP); Masakazu Yatou, Kariya (JP); Minoru Murata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/580,426

(22) PCT Filed: May 12, 2016

(86) PCT No.: PCT/JP2016/002333
§ 371 (c)(1),
(2) Date: Dec. 7, 2017

(87) PCT Pub. No.: WO2016/199349
PCT Pub. Date: Dec. 15, 2016

(65) Prior Publication Data
US 2018/0172530 A1    Jun. 21, 2018

(30) Foreign Application Priority Data

Jun. 10, 2015   (JP) ................ 2015-117574

(51) Int. Cl.
*H01L 23/10*    (2006.01)
*G01L 9/00*    (2006.01)
(Continued)

(52) U.S. Cl.
CPC .......... *G01L 9/0042* (2013.01); *G01L 9/0054* (2013.01); *H01L 21/76898* (2013.01); *H01L 23/10* (2013.01); *H01L 23/5385* (2013.01)

(58) Field of Classification Search
CPC .... H01L 23/10; H01L 23/5385; G01L 9/0042
See application file for complete search history.

(56) References Cited

U.S. PATENT DOCUMENTS 4,668,374 A * 5/1987 Bhagat ............... G01N 27/4071
                                                                204/412
4,908,693 A * 3/1990 Nishiguchi ........... G01L 9/0042
                                                                257/417
(Continued)

FOREIGN PATENT DOCUMENTS

JP        2012-195442 A     10/2012

*Primary Examiner* — Ida M Soward
(74) *Attorney, Agent, or Firm* — Posz Law Group, PLC

(57) ABSTRACT

A semiconductor device includes: a first substrate with one side on which a sensing unit for a physical quantity is arranged and multiple diffusion wiring layers electrically connected to the sensing unit are arranged by impurity diffusion; and a second substrate having one side which is bonded to the one side of the first substrate. An air tight chamber is provided between the first substrate and the second substrate. The sensing unit is sealed in the air tight chamber. The first substrate includes an outer edge portion as a portion of the one side of the first substrate surrounding multiple diffusion wiring layers, and multiple diffusion wiring layers are arranged in an inner edge portion. The outer edge portion has an impurity concentration which is constant in a circumferential direction along an edge of the first substrate.

6 Claims, 5 Drawing Sheets

(51) Int. Cl.
*H01L 21/768* (2006.01)
*H01L 23/538* (2006.01)

(56) References Cited

U.S. PATENT DOCUMENTS

| | | | |
|---|---|---|---|
| 5,923,952 A | 7/1999 | Ismail et al. | |
| 5,929,498 A | 7/1999 | Ismail et al. | |
| 6,555,901 B1* | 4/2003 | Yoshihara | B81C 1/00269 257/684 |
| 8,569,090 B2* | 10/2013 | Taheri | B81B 7/007 438/456 |
| 8,569,092 B2* | 10/2013 | Mantravadi | G01P 15/123 257/E21.214 |
| 8,648,468 B2* | 2/2014 | Chu | B81C 1/00269 257/773 |
| 8,841,734 B2* | 9/2014 | Inoue | B81C 3/001 257/414 |
| 2005/0205951 A1* | 9/2005 | Eskridge | B81B 7/007 257/416 |
| 2014/0231995 A1* | 8/2014 | Ando | B81B 7/007 257/741 |
| 2014/0240836 A1* | 8/2014 | Shinto | G02B 26/001 359/578 |
| 2015/0360938 A1* | 12/2015 | Wang | B81B 7/0077 257/414 |
| 2017/0327370 A1* | 11/2017 | Tsai | B81C 1/00182 |

\* cited by examiner

PHYSICAL QUANTITY SENSING SEMICONDUCTOR DEVICE AND METHOD FOR MANUFACTURING THE SAME

CROSS REFERENCE TO RELATED APPLICATIONS

This application is a U.S. national stage application of International Patent Application No. PCT/JP2016/002333 filed on May 12, 2016 and is based on Japanese Patent Application No. 2015-117574 filed on Jun. 10, 2015, the disclosures of which are incorporated herein by reference.

TECHNICAL FIELD

The present disclosure relates to a semiconductor device in which a first substrate and a second substrate are bonded to each other and an air tight chamber is arranged between the first substrate and the second substrate, and a method for manufacturing the same.

BACKGROUND

Conventionally, a pressure sensor is proposed as the above type of the semiconductor device (see, for example, the patent literature 1). Specifically, the pressure sensor includes a first substrate having one surface and an opposite surface. On the first substrate, a diaphragm portion is arranged by forming a concavity on the opposite surface, and further, multiple gauge resistors are formed on the diaphragm portion so as to provide a bridge circuit. More specifically, a well layer having a N conductive type is formed in the first substrate, and multiple gauge resistors are formed in the well layer. The second substrate (i.e., a cap substrate) is bonded to the one surface of the first substrate so as to form the air tight chamber between the first substrate and the second substrate and to seal the gauge resistors in the air tight chamber.

A diffusion wiring layer is formed in the first substrate by diffusing an impurity having a P conductive type in the well layer, and the diffusion wiring layer is appropriately and electrically connected to multiple gauge resistors. The diffusion wiring layer on the one surface of the first substrate is also bonded to the second substrate.

The above pressure sensor is used for detecting pressure of an oil discharged from an oil pump, for example. When a measurement medium is introduced into the concavity formed in the first substrate, the diaphragm is deformed in accordance with a pressure difference between the pressure of the measurement medium and the pressure in the air tight chamber (as a reference pressure chamber). Accordingly, the gauge resistor formed on the diaphragm is also deformed, so that the output voltage of the bridge circuit is varied, and the sensor signal according to the pressure difference is output.

However, as described above, when the device includes the diffusion wiring layer, a micro protrusion is formed since an impurity concentration in the diffusion wiring layer is different from an impurity concentration in a portion in which the diffusion wiring layer is not formed. Since the micro protrusion is formed by the difference of the impurity concentration, the protrusion is formed along a boundary between the diffusion wiring layer and the portion in which the diffusion wiring layer is not formed. Accordingly, when the first substrate is bonded to the second substrate, a space (i.e., a loose bonding portion) attributed to the protrusion is formed between the first substrate and the second substrate.

Then, for example, as shown in regions A to D in FIG. 8, the diffusion wiring layer J19a to J19d may reach an edge of the one surface of the first substrate. Specifically, the boundary between the diffusion wiring layer J19a to J19d and a region in which the diffusion wiring layer J19a to J19d is not formed is disposed at the edge of the one surface of the first substrate. Here, a dotted line in FIG. 8 shows the boundary between a portion arranged in the air tight chamber and a portion connected to the second substrate. In FIG. 8, the diffusion wiring layers J19a to J19d are hatched to easily understand the drawing although the drawing is not a cross sectional view.

In the above case, as described above, the protrusion is formed between the diffusion wiring layer and the region in which the diffusion wiring layer is not formed. When the space attributed to the protrusion is formed between the first substrate and the second substrate, the space is communicated with an outside air. Accordingly, the air tight chamber is communicated with the outside air via the space attributed to the protrusion, and therefore, leakage of the air tight chamber may occur.

PATENT LITERATURE

Patent Literature 1: JP-2012-195442

SUMMARY

It is an object of the present disclosure to provide a semiconductor device having an air tight chamber restricted from leaking and a manufacturing method of the same.

According to a first aspect of the present disclosure, a semiconductor device includes: a first substrate having one side on which a sensing unit for outputting a sensor signal corresponding to a physical quantity is arranged and a plurality of diffusion wiring layers electrically connected to the sensing unit are arranged by impurity diffusion; and a second substrate having one side which is bonded to the one side of the first substrate. An air tight chamber is provided between the first substrate and the second substrate. The sensing unit is sealed in the air tight chamber. The first substrate includes an outer edge portion as a portion of the one side of the first substrate surrounding the plurality of diffusion wiring layers, the plurality of diffusion wiring layers being arranged in an inner edge portion 15A. The outer edge portion has an impurity concentration which is constant in a circumferential direction along an edge of the first substrate.

In the above semiconductor device, a protrusion formed by a difference of impurity concentrations is restricted from reaching an edge of the one side of the first substrate. Accordingly, even if space attributed to the protrusion is formed at a bonding boundary between the first substrate and the second substrate, the space is restricted from communicating with an external environment. Thus, the air tight chamber is restricted from communicating with the external environment through the space attributed to the protrusion, and occurrence of leakage from the air tight chamber is restricted.

Alternatively, one diffusion wiring layer of the plurality of diffusion wiring layers may surround the air tight chamber. The one diffusion wiring layer may have an impurity concentration which is constant in a direction surrounding the air tight chamber. In this case, since the wiring layer and a bonding portion are shared, and therefore, the size of the plane shape is reduced, and the manufacturing cost is also reduced. Further, a double structure is formed such that the outer edge portion and the one diffusion wiring layer surround the air tight chamber. Thus, the occurrence of leakage from the air tight chamber is further restricted.

According to a second aspect of the present disclosure, a semiconductor device includes: a first substrate having one side on which a sensing unit for outputting a sensor signal corresponding to a physical quantity is arranged and a plurality of diffusion wiring layers electrically connected to the sensing unit are arranged by impurity diffusion; and a second substrate having one side which is bonded to the one side of the first substrate. An air tight chamber is provided between the first substrate and the second substrate. The sensing unit is sealed in the air tight chamber. The plurality of diffusion wiring layers are arranged in an inner edge portion 15A of the one side of the first substrate. One diffusion wiring layer of the plurality of diffusion wiring layers surrounds the air tight chamber. The one diffusion wiring layer has an impurity concentration which is constant in a direction surrounding the air tight chamber.

In the above semiconductor device, since the wiring layer and the bonding portion are shared, and therefore, the size of the plane shape is reduced, and the manufacturing cost is also reduced. Further, since the one diffusion wiring layer of the plurality of diffusion wiring layers surrounds the air tight chamber, an outer edge portion of the first substrate disposed on an outside of the one diffusion wiring layer surrounding the air tight chamber may not be bonded to the second substrate. Accordingly, when a wafer of the semiconductor substrate is divided into chips, the outer edge portion, to which stress is most easily applied, is not necessary to be bonded to the second substrate. Thus, the quality is improved.

According to a third aspect of the present disclosure, a manufacturing method of the semiconductor device according to the first aspect or the second aspect includes: forming the plurality of diffusion wiring layers by ion-implanting an impurity into the first substrate and thermally diffusing the impurity; and bonding the first substrate and the second substrate. The forming of the plurality of diffusion wiring layers includes: ion-implanting the impurity to the one side of the first substrate using a mask with an opening which has a rectangular shape and corresponds to the diffusion wiring layer surrounding the air tight chamber. In the above manufacturing method of the semiconductor device, the ion-implantation is performed using the mask having the opening, which has a rectangular shape and corresponds to the one diffusion wiring layer surrounding the air tight chamber, so that the one diffusion wiring layer having the impurity concentration, which is constant in the direction surrounding the air tight chamber, is formed. Thus, when forming the diffusion wiring layer, the formation of the micro protrusion attributed to the difference of the impurity concentrations is restricted in the diffusion wiring layer. Thus, the semiconductor device is manufactured such that the occurrence of the leakage from the air tight chamber is restricted.

BRIEF DESCRIPTION OF DRAWINGS

The above and other objects, features and advantages of the present disclosure will become more apparent from the following detailed description made with reference to the accompanying drawings. In the drawings.

EMBODIMENTS

Figure 1:
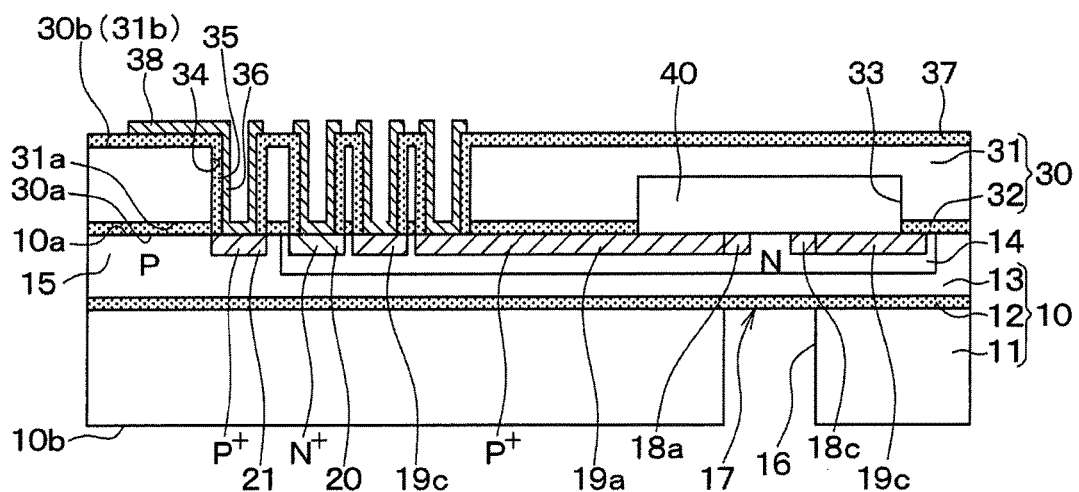
FIG. 1 is a diagram showing a cross sectional view of a semiconductor device according to a first aspect of the present disclosure.

Embodiments of the present disclosure will be explained with reference to the drawings as follows. Here, the same or the equivalent part in the embodiments has the same reference numeral in the explanation.

First Embodiment

The first embodiment of the present disclosure will be explained with reference to the drawings. Here, the present embodiment describes an example of the semiconductor device according to the present disclosure, which is applied to a pressure sensor for detecting pressure (as a physical quantity) of oil discharged from an oil pump mounted to a vehicle or the like.

Figure 2:
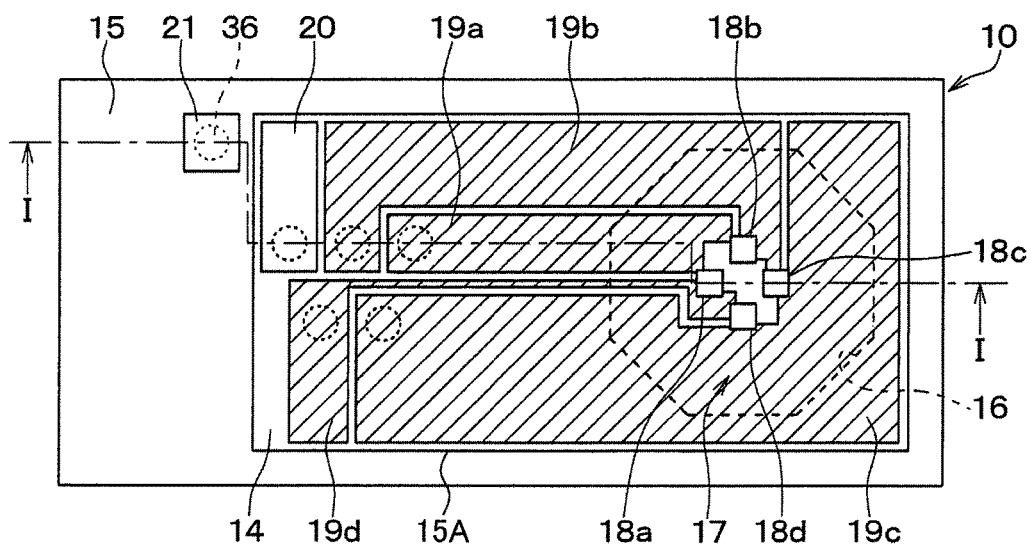
FIG. 2 is a diagram showing a plan view of a first substrate on one surface side in FIG. 1.

As shown in FIGS. 1 and 2, the pressure sensor includes a first substrate 10 having one side 10a and the other side 10b. In the present embodiment, the first substrate 10 is made of a SOI (i.e., silicon on insulator) substrate having a rectangular plane shape with one direction as a longitudinal direction (i.e., a left-right direction of the drawing in FIG. 1), in which a support substrate 11, an insulation film 12 and a semiconductor layer 13 are stacked in this order. The one surface of the semiconductor layer 13 opposite to the insulation film 12 provides the one side 10a of the first substrate 10, and the one surface of the support substrate 11 opposite to the insulation film 12 provides the other side 10b of the first substrate 10.

In the present embodiment, the support substrate 11 is made of a silicon substrate, the insulation film 12 is made of $SiO_2$, SiN or the like, and the semiconductor layer 13 is made of a silicon substrate having a P conductive type or the like. The first substrate 10 in FIG. 1 corresponds to a cross section along line I-I in FIG. 2.

In the first substrate 10, a well layer 14 having a N conductive type is formed in a surface portion of the semiconductor layer 13. Specifically, the well layer 14 is formed in an inner edge portion 15A of the semiconductor layer 13. More specifically, an outer edge portion 15 surrounding the well layer 14 is disposed on the one side 10a of the first substrate 10. The outer edge portion 15 has the P conductive type, and an impurity concentration of the outer edge portion 15 along a circumferential direction of surrounding the well layer 14 is constant. Thus, the impurity concentration in the outer edge portion 15 in the circumferential direction along the edge (i.e., the rectangular edge) of the first substrate 10 for shaping the first substrate 10 is constant. In other words, a boundary between different impurity concentration portions is not arranged at the edge of the one side 10a of the first substrate 10.

A micro protrusion attributed to a difference of the impurity concentrations is formed at a boundary portion between the well layer 14 and the outer edge portion 15 on the one side 10a of the first substrate 10. Thus, the protrusion is formed along the boundary between the well layer 14 and the outer edge portion 15, and the protrusion is formed in the circumferential direction on the one side 10a of the first substrate 10.

A diaphragm 17 is arranged on one edge side (i.e., a right side of the drawing in FIGS. 1 and 2) in the longitudinal direction of the first substrate 10 by forming a concavity 16 on the other side 10b. In the present embodiment, the concavity 16 has an opening with an octagonal shape. The concavity 16 is formed to reach the insulation film 12 from the other side 10b of the first substrate 10. Accordingly, the diaphragm 17 according to the present embodiment has an octagonal shape, and is provided by the insulation film 12 and the semiconductor layer 13 arranged between a bottom of the concavity 16 and the one side 10a of the first substrate 10.

Figure 4:
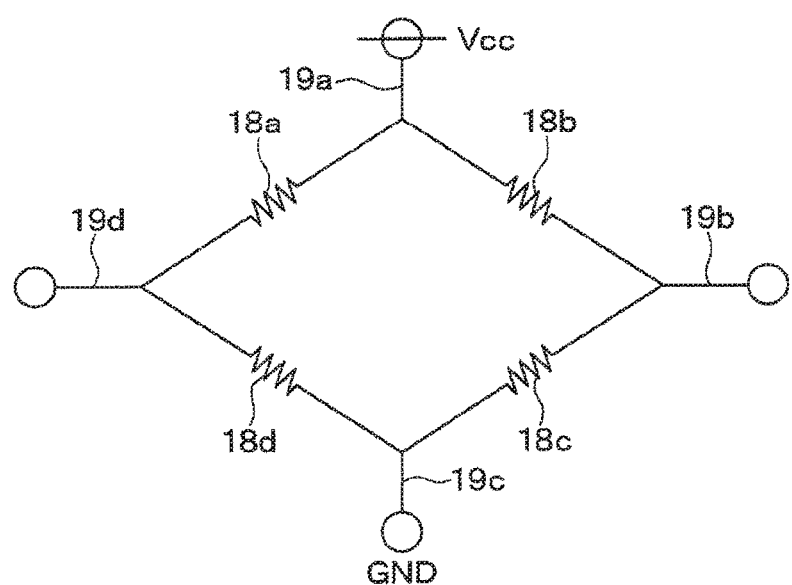
FIG. 4 is a diagram showing a bridge circuit.

As shown in FIGS. 1 and 2, the first to fourth gauge resistors 18a-18d are formed on the diaphragm 17. As shown in FIGS. 2 and 4, the first to fourth gauge resistors 18a-18d are connected to each other via first to fourth diffusion wiring layers 19a-19d to provide a bridge circuit. Here, in the present embodiment, the first to fourth gauge resistors 18a-18d correspond to a sensing unit according to the present disclosure. In FIG. 2, although not a cross sectional view, the first to fourth diffusion wiring layers 19a-19d are hatched to easily understand the drawing.

The first to fourth diffusion wiring layers 19a-19d according to the present embodiment are formed by arranging an impurity layer having the P conductive type in the well layer 14. As shown in FIG. 2, the first to fourth diffusion wiring layers 19a-19d are insulated and separated by a region of the well layer 14 in which the impurity layer is not formed (i.e., a region in which the first to fourth diffusion wiring layers 19a-19d are not formed). A surface impurity concentration of each of the first to fourth diffusion layers 19a-19d is constant.

The first diffusion wiring layer 19a is formed to connect the first gauge resistor 18a and the second gauge resistor 18b. The second diffusion wiring layer 19b is formed to connect the second gauge resistor 18b and the third gauge resistor 18c. The third diffusion wiring layer 19c is formed to connect the third gauge resistor 18c and the fourth gauge resistor 18d. The fourth diffusion wiring layer 19d is formed to connect the first gauge resistor 18a and the fourth gauge resistor 18d. Not to limit a specific feature, in the present embodiment, the first diffusion wiring layer 19a is a wiring layer for applying a power source voltage. The second and fourth diffusion wiring layers 19b, 19d are wiring layers for outputting a mid-point voltage of the bridge circuit. The third diffusion wiring layer 19c is a wiring layer connected to a ground.

The first to fourth diffusion wiring layers 19a-19d are respectively extracted from portions connected to the first to fourth gauge resistors 18a-18d to the other edge of the first substrate 10. The other edge is electrically connected to a later-described through-hole electrode 36.

In FIG. 2, a portion connected to the through-hole electrode 36 is shown as a dotted line. Further, a micro protrusion attributed to the difference of the impurity concentration is formed at a boundary among the well layer 14, the first to fourth gauge resistors 18a-18d and the first to fourth diffusion wiring layers 19a-19d on the one side 10a of the first substrate 10.

Further, a contact layer 20 having the N+ conductive type with an impurity concentration higher than the well layer 14 is formed on the other edge of the first to fourth diffusion wiring layers 19a-19d in the well layer of the semiconductor layer 13. The contact layer 20 is connected to the through-hole electrode 36 later described to maintain a predetermined electric potential of the well layer 14.

Further, a contact layer 21 having the p+ conductive type with an impurity concentration higher than the semiconductor layer 13 (as a P conductive type layer) is formed in a surface portion of the semiconductor layer 13 which is disposed on the other edge of the well layer 14. The contact layer 21 is connected to the through-hole electrode 36 later described to maintain the predetermined electric potential of the semiconductor layer 13 (i.e., a portion of the semiconductor layer 13 in which the well layer 14 is not formed).

As shown in FIG. 1, the second substrate 30 is arranged on the one side 10a of the first substrate 10. The second substrate 30 includes a bonding substrate 31 and an insulation film 32 formed on one side 31a of the bonding substrate 31 facing the first substrate 10. The one side 30a is provided by one surface of the insulation film 32 opposite to the bonding substrate 31. The bonding substrate 31 is made of a silicon substrate or the like. The insulation film 32 is made of $SiO_2$, SiN or the like. Further, the other side 30b of the second substrate 30 is provided by the other side 31b of the bonding substrate 31 opposite to the one side 31a.

A concavity 33 is formed on the one side 31a of the bonding substrate 31 at a portion of the substrate 31 facing the first to fourth gauge resistors 18a-18d. Here, in the present embodiment, the concavity 33 is shown to have an octagonal shape with an opening larger than the concavity 16. The opening of the concavity 33 may be equal to the concavity 16. Alternatively, the opening of the concavity 33 may be smaller than the concavity 16. Alternatively, the shape of the opening may be a circle shape or a rectangular shape. Thus, the shape of the opening may be appropriately changeable. Further, FIG. 1 shows that the insulation film 32 is not formed on a side wall of the concavity 33. Alternatively, the insulation film 32 may be formed on the side wall of the concavity 33.

The insulation film 32 of the second substrate 30 is bonded to the semiconductor layer 13 (of the first substrate 10). Specifically, the second substrate 30 is bonded to a region of the semiconductor layer 13 other than the diaphragm 17, the region bonded to the outer edge portion 15 of the semiconductor layer 13, the first to fourth diffusion wiring layers 19a-19d and a region of the well layer 14 in which the first to fourth diffusion wiring layers 19a-19d are not formed. Thus, an air tight chamber 40 is formed between the first substrate 10 and the second substrate 30 in the concavity 33. The first to fourth gauge resistors 18a-18d are sealed in the air tight chamber 40.

Here, the dotted line having the octagonal shape in FIG. 2 shows a boundary (i.e., the boundary of the diaphragm 17) between a portion of the first substrate 10 arranged in the air tight chamber 40 and a portion of the first substrate 10 bonded to the second substrate 30. Further, in the present embodiment, the air tight chamber 40 functions as a reference pressure chamber since predetermined pressure is applied from the air tight chamber 40 to the one side 10a of the diaphragm 17.

Here, as described above, the micro protrusion is formed at the boundary between the well layer 14 and the outer edge portion 15, and the boundary between the well layer 14 and the first to fourth gauge resistors 18a-18d or the first to fourth diffusion wiring layers 19a-19d. However, in the present embodiment, the edge of the one side 10a of the first substrate 10 is provided by the outer edge portion 15. The edge of the first substrate 10 has a constant impurity concentration along the circumferential direction. Thus, the protrusion does not reach the edge of the one side 10a on the one side 10a of the first substrate 10. Accordingly, even if a space attributed to the protrusion is formed at a bonding boundary between the first substrate 10 and the second substrate 30, the space does not communicate with an outside atmosphere.

Figure 3:
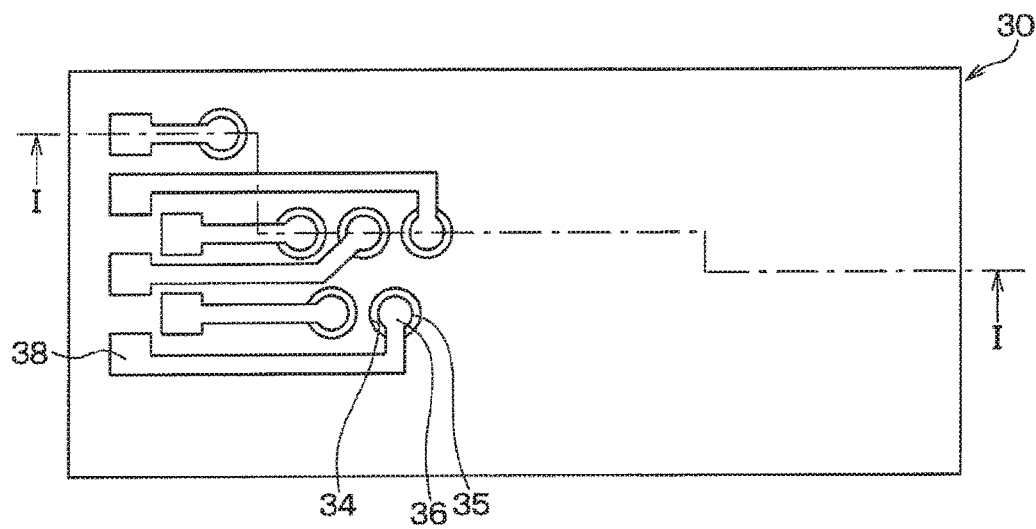
FIG. 3 is a diagram showing a plan view of a second substrate on an opposite surface side in FIG. 1.

As shown in FIGS. 1 and 3, six through holes 34 (although only four holes 34 are shown in FIG. 1) penetrating the second substrate 30 in a stacking direction of the first substrate 10 and the second substrate 30 are formed on the other edge in the second substrate 30. Specifically, the through holes 34 are formed to expose the other edge of each of the first to fourth diffusion wiring layers 19a-19d and the contact layers 20, 21, respectively. The insulation film 35 made of TEOS (i.e., tetra ethyl ortho silicate) or the like is formed on the side wall of the through hole 34. The through hole electrode 36 made of aluminum or the like is formed on the insulation film 35 to electrically connect the first to fourth diffusion wiring layers 19a-19d and the contact layers 20, 21 appropriately. Here, the second substrate 30 in FIG. 1 corresponds to the cross section along line I-I in FIG. 3.

Further, the insulation film 37 is formed on the other side 30b (i.e., the other side 31b of the bonding substrate 31) of the second substrate 30. A pad 38 is formed on the insulation film 37 to be electrically connected to the through hole electrode 36 and an external circuit via a bonding wire or the like not shown. In the present embodiment, the through hole electrode 36 and the pad 38 are made of aluminum or the like. The insulation film 37 is made of TEOS or the like.

Thus, the pressure sensor according to the present embodiment has the above constitution. Such a pressure sensor detects pressure in a state such that the well layer 14 (or the contact layer 20) having the N conductive type has an electric potential higher than the first to fourth gauge resistors 18a-18d having the P conductive type, the first to fourth diffusion wiring layers 19a-19d and the semiconductor layer 13 (i.e., the contact layer 21). Thus, the pressure is detected under a condition that a reverse bias voltage is applied to a diode provided by the well layer 14 having the N conductive type and the first to fourth gauge resistors 18a-18d having the P conductive type, the first to fourth diffusion wiring layers 19a-19d or the semiconductor layer 13 (i.e., the contact layer 21).

When the pressure of a measurement medium is applied to the other side 10b of the diaphragm 17, the diaphragm 17 is deformed according to pressure difference between the measurement pressure and the pressure (i.e., the reference pressure) applied to the one side 10a from the air tight chamber 40. Thus, a sensor signal corresponding to the deformation is output. Accordingly, the pressure of the measurement medium is detected in accordance with the sensor signal.

Next, a manufacturing method of the above described semiconductor device will be explained with reference to FIGS. 5A to 6C. Here, FIGS. 5A to 6C are cross sectional views of a part corresponding to FIG. 1.

Figure 5A:
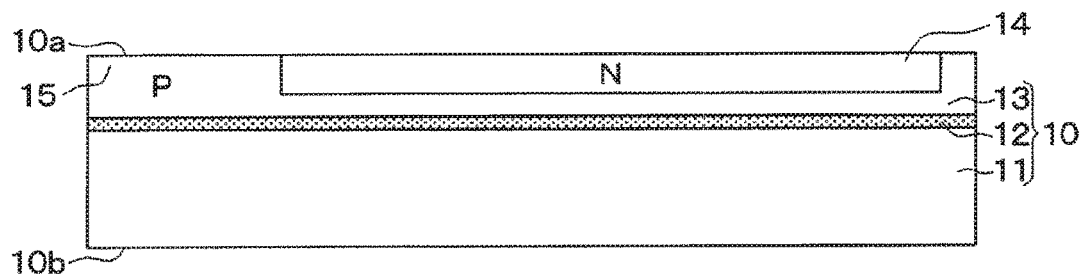
FIGS. 5A to 5C are diagrams showing cross sectional views of a manufacturing process of the semiconductor device shown in FIG. 1.

First, as shown in FIG. 5A, the first substrate 10 in which the support substrate 11, the insulation film 12 and the semiconductor layer 13 are stacked in this order is prepared. The mask is formed on the one side 10a. Then, the well layer 14 is formed by implanting an impurity having the N conductive type as an ion and thermally diffusing the impurity. Here, in this step, the micro protrusion may be formed by the difference of the impurity concentration at the boundary between the well layer 14 and the outer edge portion 15. Specifically, the protrusion is formed along the boundary between the well layer 14 and the outer edge portion 15. Accordingly, the protrusion does not reach the edge of the one side 10a of the first substrate 10.

Figure 5B:
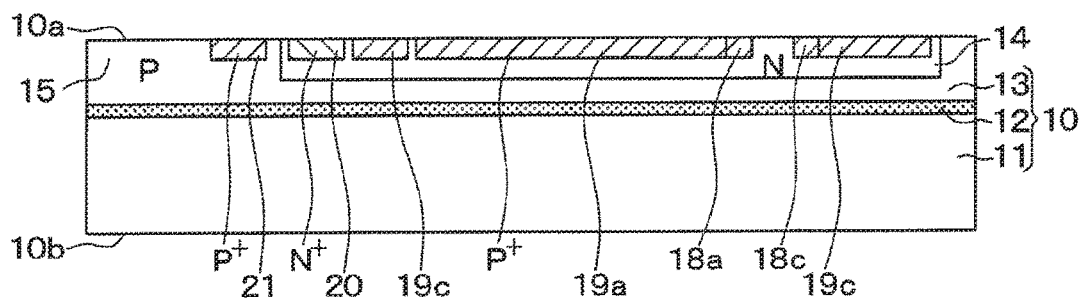
Figure 5C:
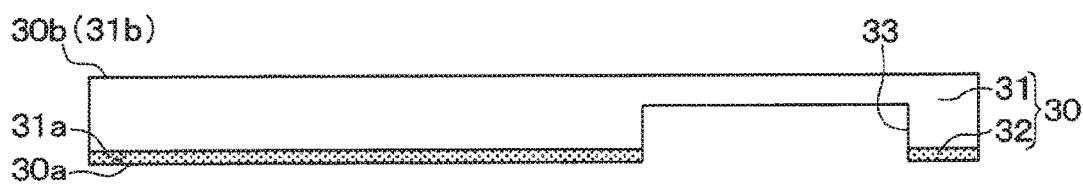

Next, as show in FIG. 5B, the mask is formed again on the one side 10a of the first substrate 10. Then, the impurity having the P conductive type is ion-implanted, and the impurity is thermally diffused, so that the first to fourth gauge resistors 18a-18d, the first to fourth diffusion wiring layers 19a-19d and the contact layer 21 are formed. Similarly, the mask is formed on the one side 10a of the first substrate 10. Then, the impurity having the N conductive type is ion-implanted, and the impurity is thermally diffused, so that the contact layer 20 is formed.

Here, in the above steps, similar to the step in FIG. 5A, the micro protrusion is formed by the difference of the impurity concentration at the boundary among the well layer 14 and the first to fourth gauge resistors 18a-18d, the first to fourth diffusion wiring layers 19a-19d or the contact layers 20, 21. Alternatively, in the above steps, in order to restrict cross-contamination and the like in case of the ion-implantation, the through oxide film may be formed, and the ion implantation may be performed through the through oxide film.

In a step different from the steps in FIGS. 5A and 5B, the bonding substrate 31 is prepared, and the insulation film 32 is formed on the one side 31a of the bonding substrate 31 by the thermal oxidation or the like. Then, the mask is formed on the insulation film 32, and the concavity 33 is formed by the dry-etching method or the like. Thus, the second substrate 30 is prepared.

Figure 6A:
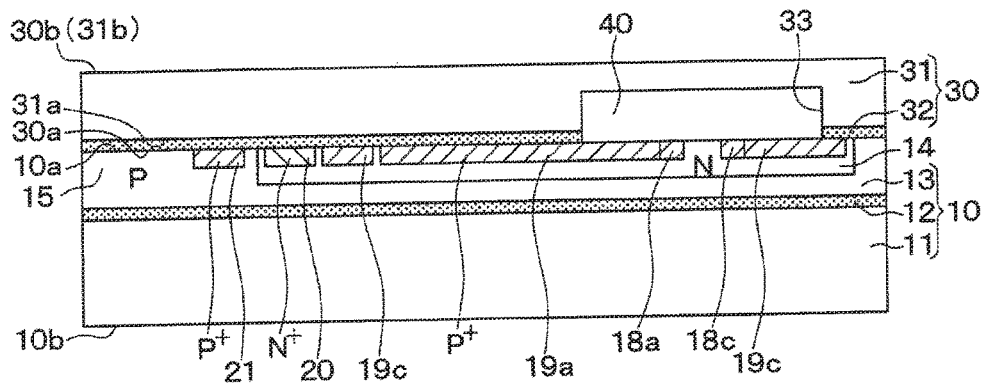
FIGS. 6A to 6C are diagrams showing cross sectional views of the manufacturing process following a step in FIG. 5C.

Next, as shown in FIG. 6A, the first substrate 10 and the second substrate 30 are bonded to each other. In the present embodiment, first, the argon ion beam or the like is irradiated on the one side 10a (as a bonding surface) of the first substrate 10 and the one side 30a (as a bonding surface) of the second substrate 30, so that each bonding surface is activated. The alignment is performed with an infra-red microscope or the like using alignment marks appropriately arranged on the first substrate 10 and the second substrate 30. Then, the direct bonding method for bonding in low temperature between room temperature and 550 degrees Celsius, so that the first substrate 10 and the second substrate 30 are bonded to each other. Thus, the air tight chamber 40 is prepared so as to include space between the first substrate 10 and the concavity 33 of the second substrate 30. The first to fourth gauge resistors 18a-18d are sealed in the air tight chamber 40.

At that time, since the protrusion is formed on the surface of the first substrate 10 as described above, clearance may be formed at a portion of the first substrate 10 on which the protrusion is formed. However, in the present embodiment, since the protrusion does not reach the edge of the surface of the first substrate 10, the clearance is restricted from communicating with the external environment. Accordingly, the air tight chamber 40 is restricted from communicating with the external environment, so that the leakage from the air tight chamber 40 is restricted.

Figure 6B:
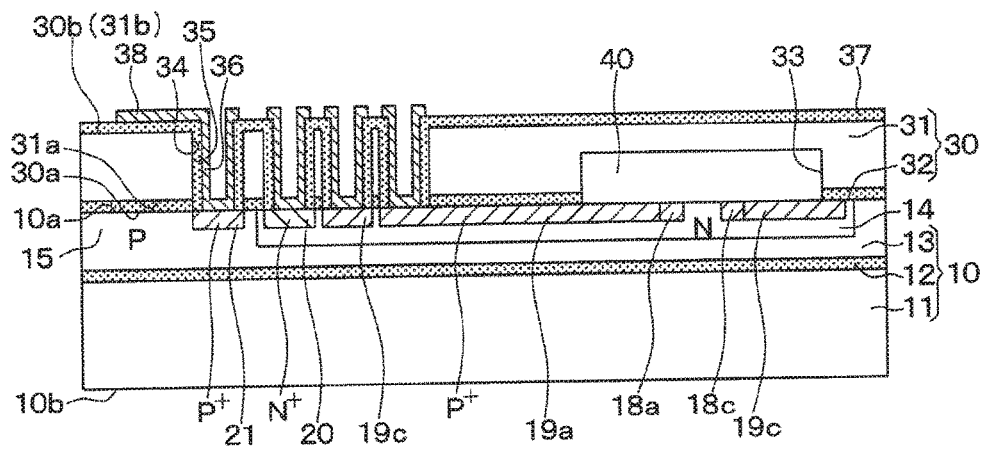

Successively, as shown in FIG. 6B, six through holes 34 are formed in the second substrate 30 by the dry etching method or the like so as to penetrate in the stacking direction of the first substrate 10 and the second substrate 30 and to expose the other edge of each of the first to fourth diffusion wiring layers 19a-19d and the contact layers 20, 21 (in FIG. 6B, only four holes 34 are shown). Then, the insulation film 35 made of the TEOS or the like is deposited on the side wall of each through hole 34. At this time, the insulation film 37 is prepared by the insulation film on the other side 30b of the second substrate 30. Next, the insulation film 35 formed on the bottom of each through hole 34 is removed. Then, a metal film made of aluminum, Al—Si or the like is deposited in each through hole 34 by the sputtering method, the evaporation method or the like, so that the through hole electrode 36 is formed to be electrically connected to the other edge of the first to fourth diffusion wiring layers 19a-19d and the contact layers 20, 21. Then, a pad 38 is formed by patterning the metal film on the insulation film 37 appropriately to be electrically connected to the through hole electrode 36.

Figure 6C:
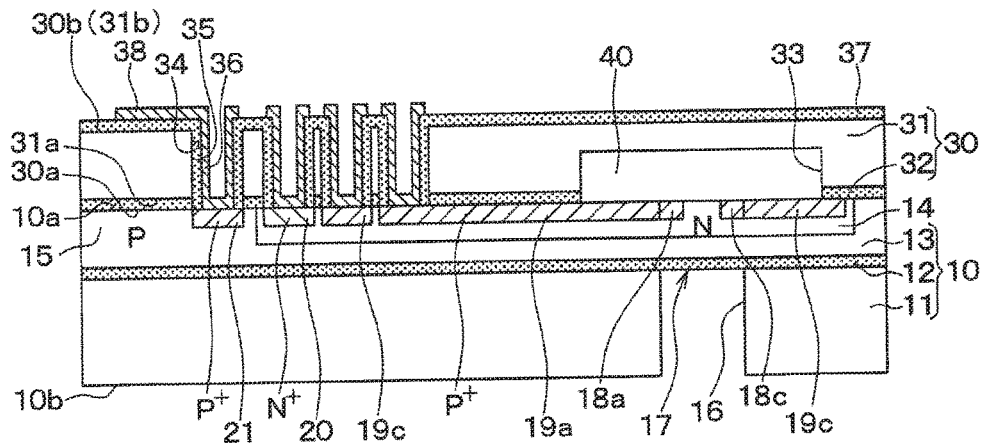

Then, as shown in FIG. 6C, the mask is formed on the other side 10b of the first substrate 10, and the concavity 16 is formed by the dry etching method or the like so that the diaphragm 17 is prepared. Thus, the pressure sensor shown in FIG. 1 is manufactured.

Here, the manufacturing method of one pressure sensor is described above. Alternatively, a wafer including the first substrate 10 and a wafer including the second substrate 30 may be prepared, and the above steps may be performed using the wafers. Then, the wafers may be cut by the dicing method so that the wafers are divided into chips.

As described above, in the present embodiment, the outer edge portion 15 of the one side 10a of the first substrate 10 in which no boundary of different impurity concentrations is disposed provides the edge of the one side 10a of the first substrate 10. Thus, the protrusion attributed to the impurity concentration difference does not reach the edge of the one side 10a of the first substrate 10. Accordingly, even if the space attributed to the protrusion is formed at the bonding boundary between the first substrate 10 and the second substrate 30, the space does not communicate with the external environment. Accordingly, the communication between the air tight chamber 40 and the external environment via the space attributed to the protrusion is restricted, and therefore, the occurrence of the leakage from the air tight chamber 40 is restricted.

Second Embodiment

The second embodiment of the present disclosure will be explained. In the present embodiment, the formation place of the first to fourth diffusion wiring layers 19a-19d is changed from the first embodiment. Other features are similar to the first embodiment. Thus, the explanation of the other features is skipped.

Figure 7:
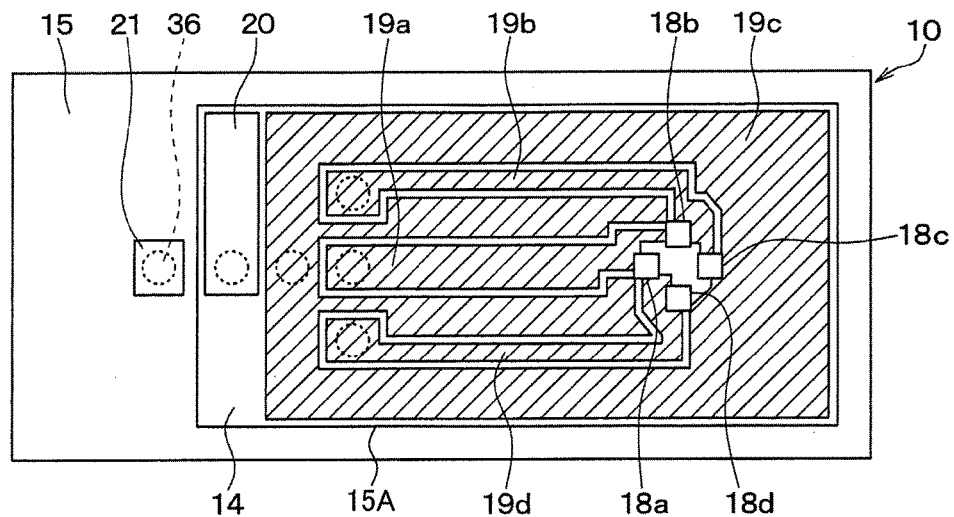
FIG. 7 is a diagram showing a plan view of the first substrate of the semiconductor device on the one surface side according to a second embodiment of the present disclosure.
Figure 8:
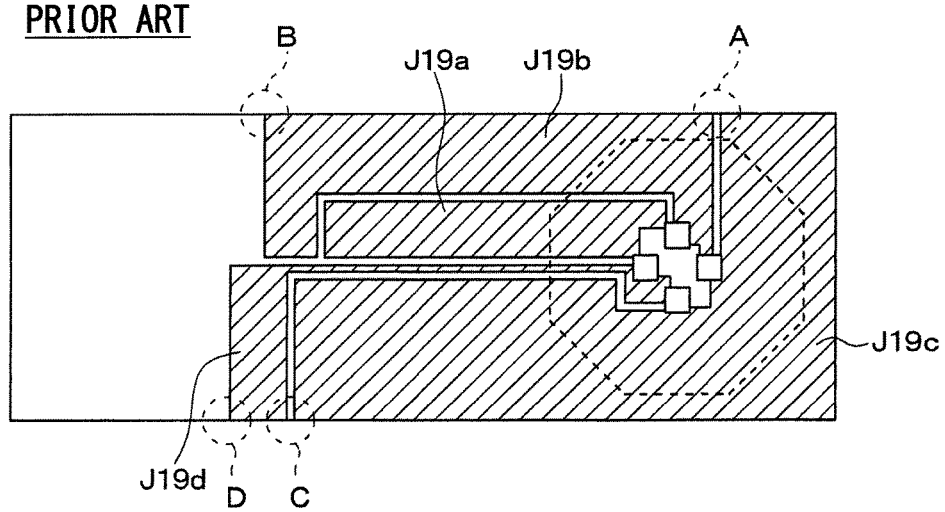
FIG. 8 is a diagram showing a plan view of a first substrate of a semiconductor device on a one surface side according to a prior art.

In the present embodiment, as shown in FIG. 7, the third diffusion wiring layer 19c is formed to surround the air tight chamber 40 (and the first, the second and the fourth diffusion wiring layers 19a, 19b, 19d). Thus, the impurity concentration (i.e., the surface impurity concentration) on the one side 10a of the first substrate 10 in a region disposed inside the outer edge portion 15 is constant in a surrounding direction (i.e., a circumferential direction) of the air tight chamber 40 since the third diffusion wiring layer 19c is arranged.

Thus, the third diffusion wiring layer 19c is formed to surround the first, the second and the fourth diffusion wiring layers 19a, 19b, 19d. Thus, the present embodiment provides a double structure such that the outer edge portion 15 and the third diffusion wiring layer 19c surround the air tight chamber 40 (and the first, the second and the fourth diffusion wiring layers 19a, 19b, 19d). Accordingly, even if the space is formed at the bonding boundary between the outer edge portion 15 of the first substrate 10 and the second substrate 30, the communication between the space and the air tight chamber 40 is restricted by the bonding portion between the third diffusion wiring layer 19c and the second substrate 30. Thus, the occurrence of the leakage from the air tight chamber 40 is much restricted.

Here, in the present embodiment, in general, the sensor is manufactured similar to the manufacturing method of the first embodiment. In FIG. 5B, the impurity is ion-implanted using the mask having an opening facing the third diffusion wiring layer 19c. Thus, the impurity is ion-implanted using the mask having the opening with a rectangular shape. In other words, the mask has the opening corresponding to a portion facing the third diffusion wiring layer 19c, and the opening is unicursal. The impurity is ion-implanted using the mask not divided. The third diffusion wiring layer 19c is formed such that the impurity concentration (i.e., the surface impurity concentration) thereof is constant in the surrounding direction (i.e., the circumferential direction) of the air tight chamber 40. Further, the first to fourth gauge resistors 18a-18d, the first, the second and the third diffusion wiring layers 19a, 19b, 19d and the contact layers 20, 21 are formed. Thus, before bonding with the second substrate 30, the third diffusion wiring layer 19c is formed so as to control the impurity concentration (i.e., the surface impurity concentration) thereof to be constant in the surrounding direction (i.e., the circumferential direction) of the air tight chamber 40. Thus, when the third diffusion wiring layer 19c is formed, the micro protrusion attributed to the difference of the impurity concentrations is restricted from being formed in the third diffusion wiring layer 19c.

Other Embodiments

For example, in each of the above embodiments, the pressure sensor is explained as an example. Alternatively, the present disclosure may be applied to a semiconductor device having a diffusion wiring layer which is bonded to a second substrate.

In each of the above embodiments, the semiconductor layer 13, the first to fourth gauge resistors 18a-18d, the first to fourth diffusion wiring layers 19a-19d and the contact layer 21 may have the N conductive type, and the well layer 14h and the contact layer 20 may have the P conductive type.

In each of the above embodiments, the diaphragm 17 may be formed of the semiconductor layer 13 only. Thus, the insulation film 12 may be removed by the concavity 16.

In the above second embodiment, a diffusion wiring layer other than the third diffusion wiring layer 19c may surround other diffusion wiring layers.

Alternatively, in the above second embodiment, the impurity concentration of the outer edge portion 15 may be not constant in the circumferential direction for surrounding the well layer 14. Alternatively, in the above second embodiment, the outer edge portion 15 may be divided so as not to surround the well layer 15. Even in this type of the pressure sensor, since the third diffusion wiring layer 19c surrounds the air tight chamber 40 (and the first, the second and the fourth diffusion wiring layers 19a, 19b, 19d), the occurrence of the leakage from the air tight chamber 40 is restricted. Further, since the third diffusion wiring layer 19c is formed to surround the air tight chamber 40, the area of the outer edge portion 15 may be reduced. Thus, the size of the planar shape may be reduced, and further, the manufacturing cost may be also reduced. Further, since the third diffusion wiring layer 19c is formed to surround the air tight chamber 40, the outer edge portion 15 may not be bonded to the second substrate 30. In this case, when the pressure sensor is provided by dividing the wafer of the semiconductor substrate into chips, the outer edge portion 15 to which the stress is applied most easily may not be bonded to the second substrate, so that the quality is improved.

In each of the above embodiments, the photo-resist may be formed after the insulation film is formed on the one side 10a of the first substrate 10. Using the photo-resist as the mask, the insulation film may be remained at a portion arranged between the gauge resistors 18a-18d. In this case, the occurrence of the outward diffusion (i.e., out-diffusion) at a portion between the gauge resistors 18a-18d is restricted. Thus, the occurrence of the leakage between the gauge resistors 18a-18d is restricted.

Here, when patterning the insulation film, it is preferable to use the photo-resist having at least the opening facing the third diffusion wiring layer 19c as the mask. Using this type of the photo-resist as the mask, when patterning the insulation film, the local change amount of the impurity concentration in the third diffusion wiring layer is equalized if the impurity concentration of the third diffusion wiring layer is changed. Thus, the impurity concentration (i.e., the surface impurity concentration) is constant in the surrounding direction of the air tight chamber 40 is constant, and the insulation film is patterned.

When arranging the insulation film, the trench may be formed at a portion between the gauge resistors 18a-18d on the one side 10a of the first substrate 10, and the insulation film may be formed in the trench.

Further, in each of the above embodiments, the bonding method of the first and the second substrates 10, 30 may be a bonding technique such as an anodic bonding method, an intermediate layer bonding method, a fusion bonding method or the like. After bonding, a process for improving the bonding quality such as high temperature anneal may be performed.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
   a first substrate having one side on which a sensing unit for outputting a sensor signal corresponding to a physical quantity is arranged and a plurality of diffusion wiring layers electrically connected to the sensing unit are arranged by impurity diffusion; and
   a second substrate having one side which is bonded to the one side of the first substrate, wherein:
   an air tight chamber is provided between the first substrate and the second substrate;
   the sensing unit is sealed in the air tight chamber;
   the first substrate includes an outer edge portion as a portion of the one side of the first substrate surrounding the plurality of diffusion wiring layers, the plurality of diffusion wiring layers being arranged in an inner edge portion; and
   the outer edge portion has an impurity concentration which is constant in a circumferential direction along an edge of the first substrate.

2. The semiconductor device according to claim 1, wherein:
   one diffusion wiring layer of the plurality of diffusion wiring layers surrounds the air tight chamber; and
   the one diffusion wiring layer has an impurity concentration which is constant in a direction surrounding the air tight chamber.

3. A manufacturing method of the semiconductor device according to claim 2, comprising:
   forming the plurality of diffusion wiring layers by ion-implanting an impurity into the first substrate and thermally diffusing the impurity; and
   bonding the first substrate and the second substrate, wherein:
   the forming of the plurality of diffusion wiring layers includes: ion-implanting the impurity to the one side of the first substrate using a mask with an opening which has a rectangular shape and corresponds to the diffusion wiring layer surrounding the air tight chamber.

4. The semiconductor device according to claim 1, wherein:
   the outer edge portion is bonded to the one side of the second substrate to provide the air tight chamber.

5. A semiconductor device comprising:
   a first substrate having one side on which a sensing unit for outputting a sensor signal corresponding to a physical quantity is arranged and a plurality of diffusion wiring layers electrically connected to the sensing unit are arranged by impurity diffusion; and
   a second substrate having one side which is bonded to the one side of the first substrate, wherein:
   an air tight chamber is provided between the first substrate and the second substrate;
   the sensing unit is sealed in the air tight chamber;
   the plurality of diffusion wiring layers are arranged in an inner edge portion of the one side of the first substrate;
   one diffusion wiring layer of the plurality of diffusion wiring layers surrounds the air tight chamber; and
   the one diffusion wiring layer has an impurity concentration which is constant in a direction surrounding the air tight chamber.

6. The semiconductor device according to claim 5, wherein:
   the one diffusion wiring layer is bonded to the one side of the second substrate to provide the air tight chamber.

* * * * *